(12) United States Patent
Chen (10) Patent No.: US 7,233,475 B1
(45) Date of Patent: Jun. 19, 2007

(54) INTEGRATED CIRCUIT WITH AN ELECTROSTATIC DISCHARGE PROTECTION CIRCUIT

(75) Inventor: Shiao-Shien Chen, Hsin-Chu (TW)

(73) Assignee: Novatek Microelectronics Corp., Hsin-Chu (TW)

( * ) Notice: Subject to any disclaimer, the term of this patent is extended or adjusted under 35 U.S.C. 154(b) by 75 days.

(21) Appl. No.: 11/279,572

(22) Filed: Apr. 13, 2006

(30) Foreign Application Priority Data

Feb. 16, 2006 (TW) .............................. 95105270 A (51) Int. Cl.
*H02H 3/22* (2006.01)
(52) U.S. Cl. .................. 361/111; 361/56; 361/91.1; 257/355; 257/356
(58) Field of Classification Search ............... 361/56, 361/111, 91, 91.1; 257/355
See application file for complete search history.

(56) References Cited

U.S. PATENT DOCUMENTS 4,630,162 A * 12/1986 Bell et al. ................... 361/56
5,521,789 A * 5/1996 Ohannes et al. ........... 361/111
5,528,188 A * 6/1996 Au et al. .................... 327/310
6,072,219 A   6/2000 Ker et al.
6,465,768 B1 10/2002 Ker et al.
6,469,353 B1 * 10/2002 Amerasekera et al. ...... 257/356

OTHER PUBLICATIONS

Charvaka Duvvury et al, "Substrate Pump NMOS for ESD Protection Applications.", EOS/ESD Symposium, pp. 1A.2.1-1A.2.11, Silicon Technology Development, Texas Instruments, Dallas, Texas.
Ming-Dou Ker, Tung-Yang Chen. "Substrate-Triggered ESD Protection Circuit Without Extra Process Modification.", IEEE Journal of Solid-State Circuits, Feb. 2003, pp. 295-302, vol. 38, No. 2.

* cited by examiner

*Primary Examiner*—Stephen W. Jackson
*Assistant Examiner*—Terrence Willoughby
(74) *Attorney, Agent, or Firm*—Winston Hsu (57) ABSTRACT

MOS Transistors and bipolar junction transistors are connected to input pads and output pads for implementing electrostatic discharge protection. By conducting a power clamp circuit and applying a substrate-trigger technology, electrostatic discharge protection is further enhanced. For instance, positive ESD stress protection can be enhanced between signal pads (input pads and output pads) and VSS by using NMOS transistors and field oxide devices. Negative ESD stress protection can be enhanced between signal pads and VDD by using PMOS transistors.

13 Claims, 12 Drawing Sheets

INTEGRATED CIRCUIT WITH AN ELECTROSTATIC DISCHARGE PROTECTION CIRCUIT

BACKGROUND OF THE INVENTION

1. Field of the Invention

The present invention relates to an integrated circuit, and more particularly, to an integrated circuit with an electrostatic discharge protection circuit.

2. Description of the Prior Art

Generally, electrostatic discharge (ESD) stress testing for integrated circuits (ICs) include pin-to-pin testing modes, such as a positive-to-VSS (PS) mode, a negative-to-VSS (NS) mode, a positive-to-VDD (PD) mode and a negative-to-VDD (ND) mode, and a testing mode between power pins, such as a VDD-to-VSS (DS) mode. Take the PS mode for example. A positive ESD stress is applied to an input pin to be tested so as to discharge a VSS pin connected to ground while a VDD pin and other pins are floating.

For complementary metal-oxide semiconductor (CMOS) integrated circuits, components for ESD protection circuits can be diffusion or poly-resistors, diodes with p-n junction, MOS transistors, field-oxide devices, bipolar junction transistors, or SCR devices with p-n-p-n structure. However, these components have different properties and thereby have different ESD protection capabilities.

Figure 1:
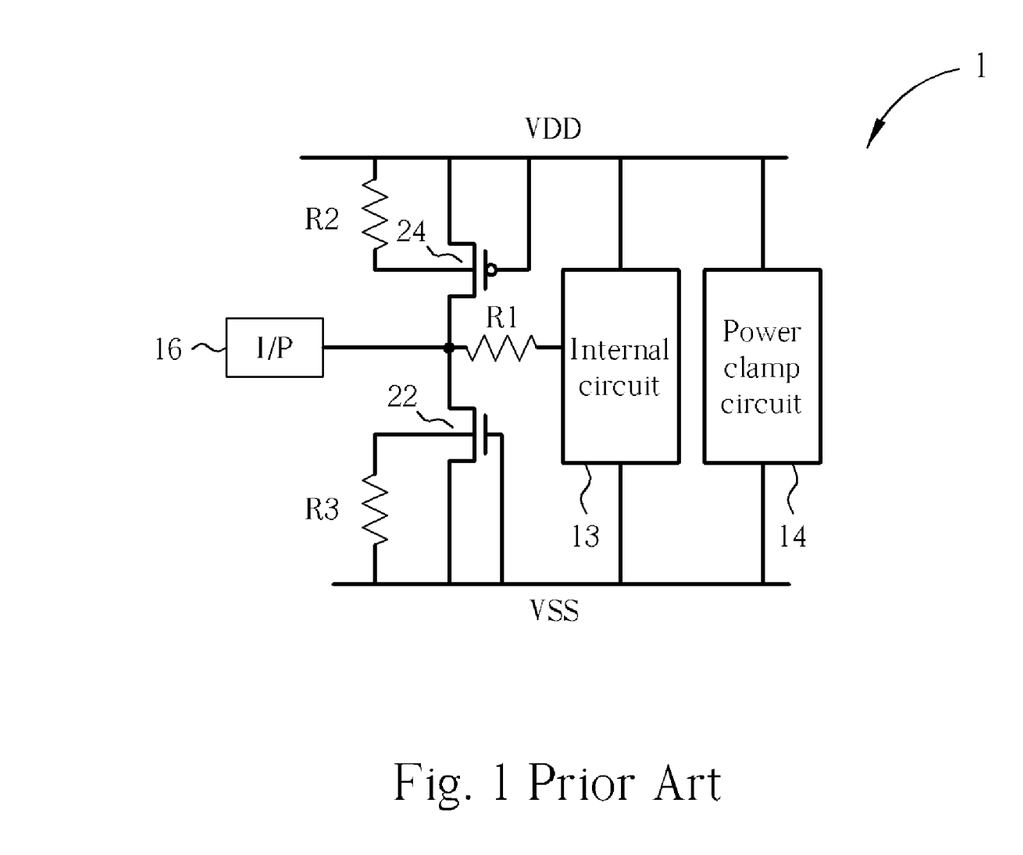
FIG. 1 to FIG. 4 are diagrams of ESD protection circuits in integrated circuits based on the prior art.

Please refer to FIG. 1, which is an input ESD protection circuit in an integrated circuit 1 based on the prior art. The IC 1 comprises an input pad (I/P) 16, an input resistor R1, an internal circuit 13, a power clamp circuit 14, and an input ESD protection circuit. The input ESD protection circuit comprises two parasitical resistances R2, R3, an N-type metal oxide semiconductor (MOS) transistor 22 and a PMOS transistor 24, so that ESD protection is formed between the input pad 16 and VDD and between the input pad 16 and VSS. The power clamp circuit 14 is an ESD protection between VDD and VSS.

The input ESD protection circuit of FIG. 1 utilizes a gate-grounded NMOS transistor and a gate-grounded PMOS transistor, generating a protection circuit for two-way protection. It can provide a good performance for ESD protection, but triggering voltages for transistors are significantly high.

Figure 2:
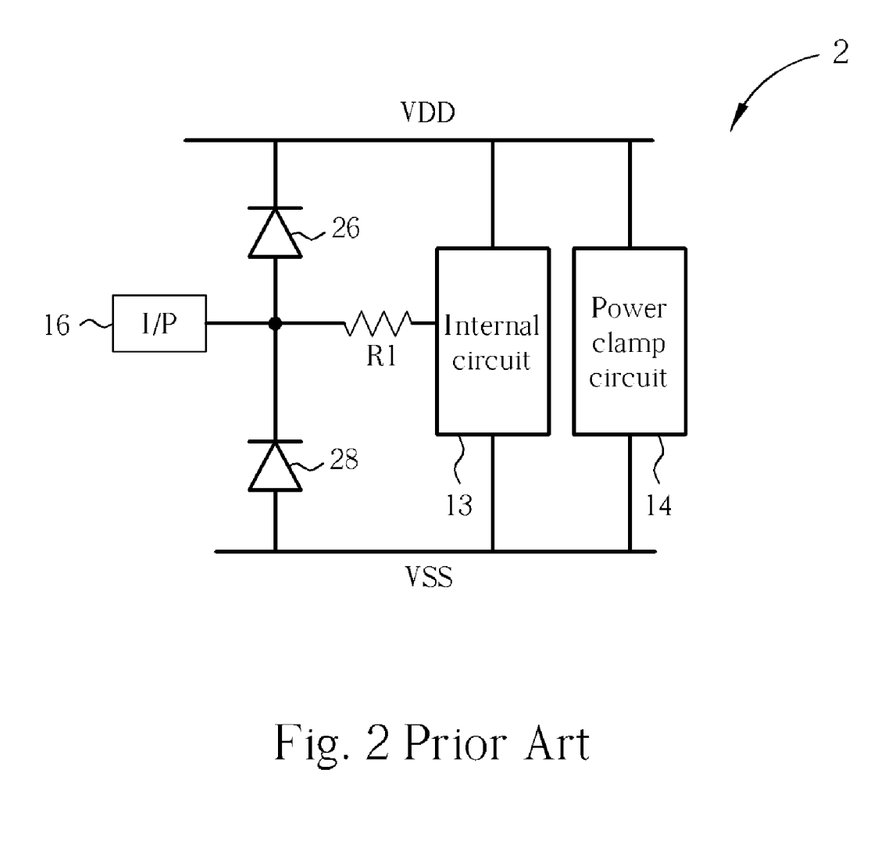

Pleaser refer to FIG. 2, which is an input ESD protection circuit in an integrated circuit 2 based on the prior art. The input ESD protection circuit of the IC 2 comprises two diodes 26, 28 so as to form ESD protection between the input pad 16 and VDD and between the input pad 16 and VSS.

For example, since a forward-biased diode has a working voltage (about 0.8 to 1.2 volts) far smaller than that (about −13 to −15 volts) of a reverse-biased diode, heat generated by the forward-biased diode is accordingly far smaller than that of the reverse-biased diode if ESD currents flowing through these two diodes are equal. The forward-biased diode has an ESD protection capability far superior to that of the reverse-biased diode if their sizes are equal. A diode that an ESD protection circuit comprises is usually forward-biased. Therefore, it only provides a one-way ESD protection circuit with lower ESD protection capability than that of FIG. 1.

Figure 3:
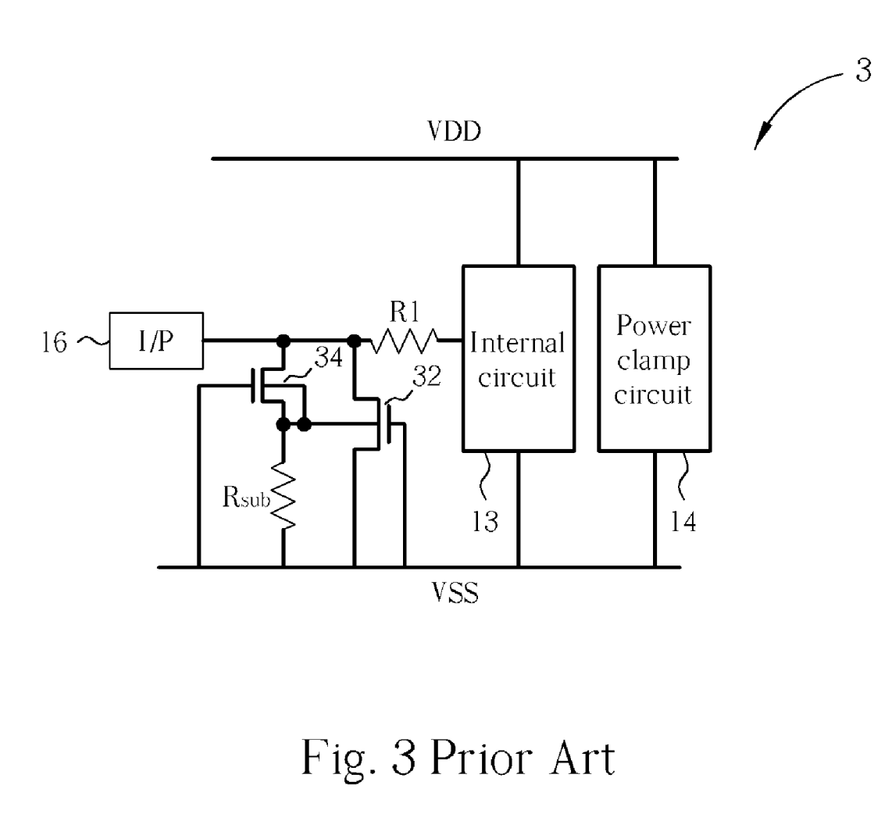

Please refer to FIG. 3, which is an input ESD protection circuit in an integrated circuit 3 based on the prior art. The input ESD protection circuit of the IC 3 comprises two NMOS transistors 32, 34, and a parasitical substrate resistance $R_{sub}$ to form the ESD protection circuit.

In FIG. 3, the prior art adopts a substrate-triggered technology to improve the performance of ESD protection. As shown in FIG. 3, the transistor 34 is made to be in the breakdown situation to trigger a body terminal of the transistor 32 to be turned on, so that the ESD current can be bypassed through the transistor 32. However, the drawback is that the triggering voltage of the transistor 34 in the breakdown situation is high.

Figure 4:
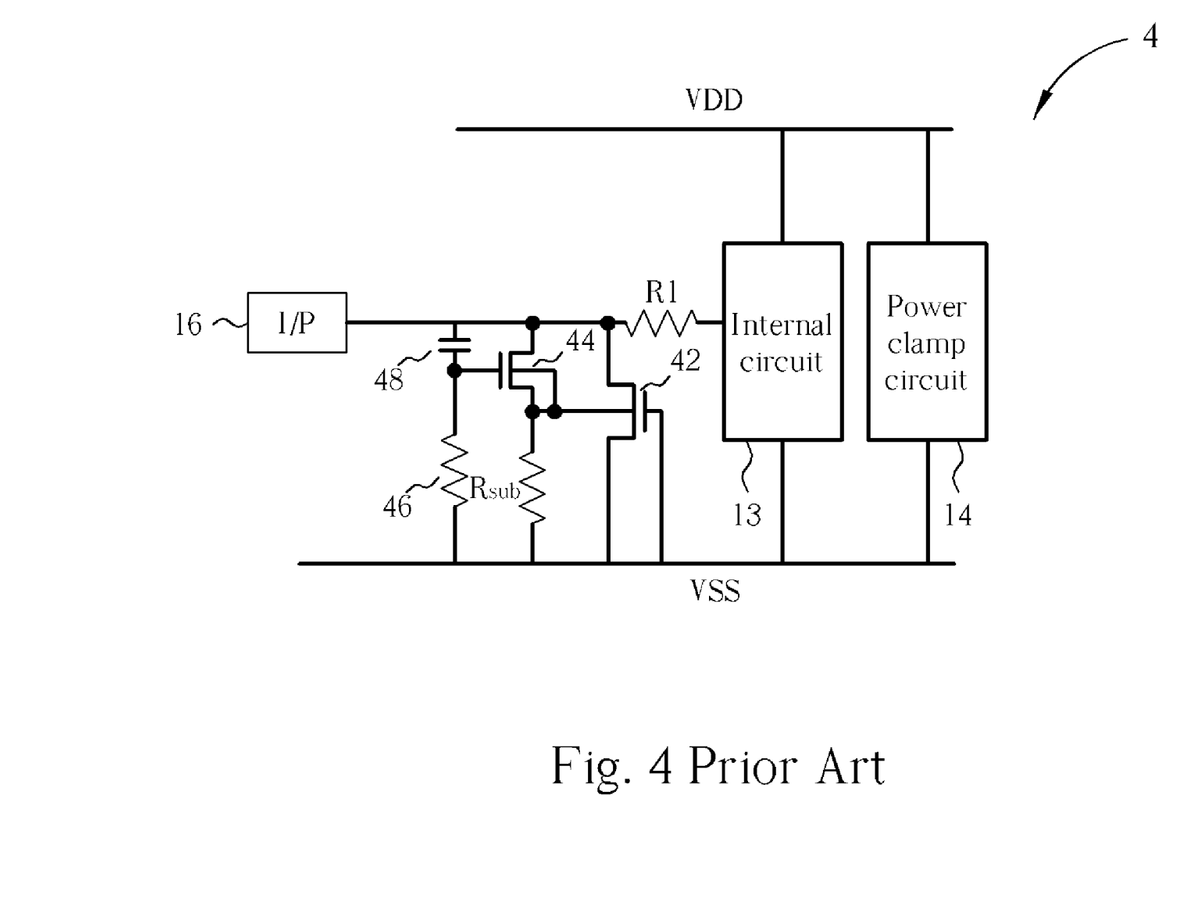

Please refer to FIG. 4, which is an input ESD protection circuit in an integrated circuit 4 based on the prior art. The input ESD protection circuit of the IC 4 comprises two NMOS transistors 44, 42, a resistor 46, a capacitor 48, and a parasitical substrate resistance $R_{sub}$ to form the ESD protection circuit.

In FIG. 4, the prior art utilizes the resistor 46 and the capacitor 48 to charge and discharge. As shown in FIG. 4, the transistor 44 is turned on earlier so as to bypass the ESD current. Since the charge/discharge time depends on values of the resistor 46 and the capacitor 48, high loading at the input pad 16 results and performance for high-speed data access is reduced.

SUMMARY OF THE INVENTION

The claimed invention provides an integrated circuit with an electrostatic discharge protection circuit. The integrated circuit comprises a first power pad, a second power pad, a power clamp circuit, an internal circuit, a signal pad, a bipolar junction transistor, and a metal-oxide semiconductor transistor. The power clamp circuit is electrically connected between the first power pad and the second power pad; the internal circuit is electrically connected between the first power pad and the second power pad; the signal pad is electrically connected to the internal circuit; the bipolar junction transistor has a base electrically connected to the first power pad and an emitter electrically connected to the signal pad; and the metal-oxide semiconductor transistor has a drain electrically connected to the signal pad, a source electrically connected to the second power pad, and a body electrically connected to a collector of the bipolar junction transistor. A parasitical resistance is between the collector of the bipolar junction transistor and the second power pad.

These and other objectives of the present invention will no doubt become obvious to those of ordinary skill in the art after reading the following detailed description of the preferred embodiment that is illustrated in the various figures and drawings.

DETAILED DESCRIPTION

Figure 5:
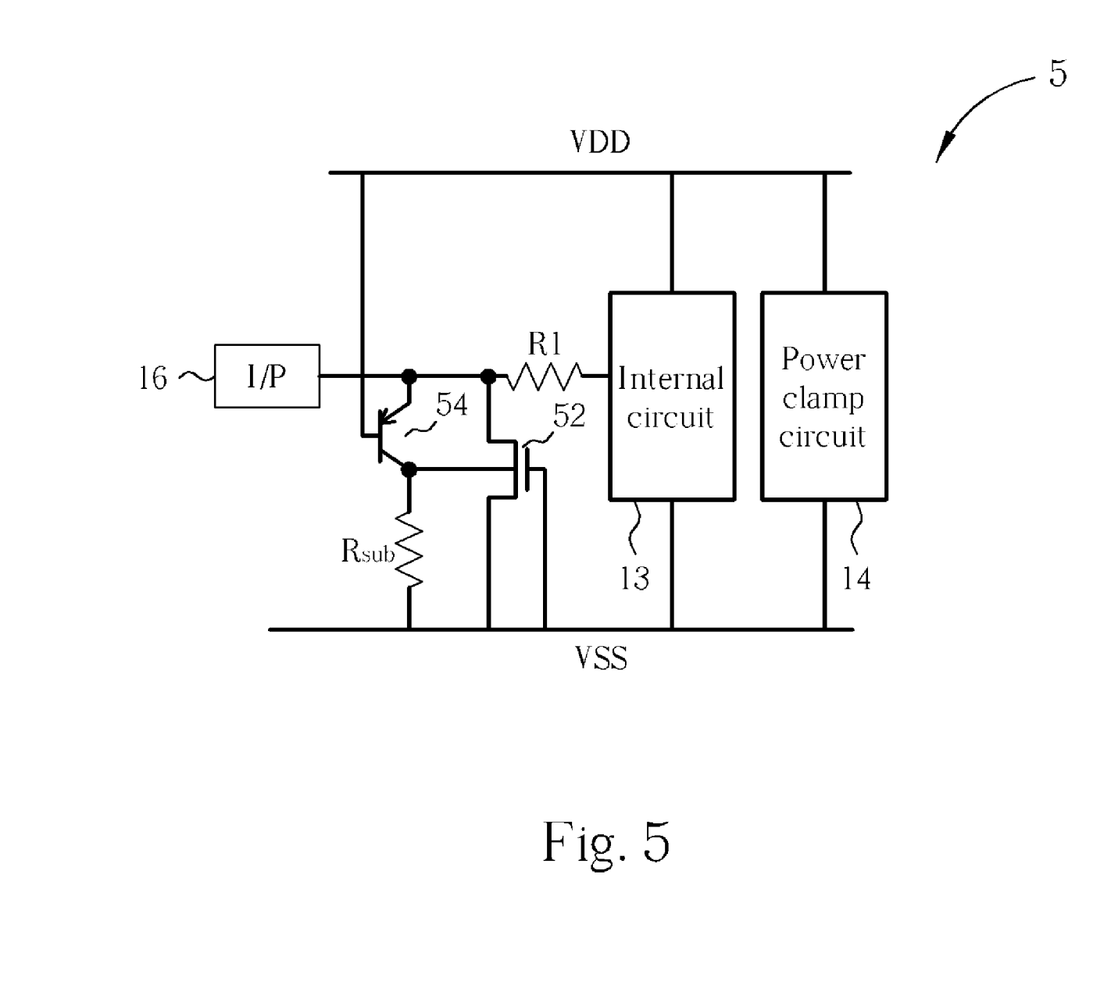
FIG. 5 to FIG. 12 are diagrams of ESD protection circuits in integrated circuits based on the present invention.
Figure 6:
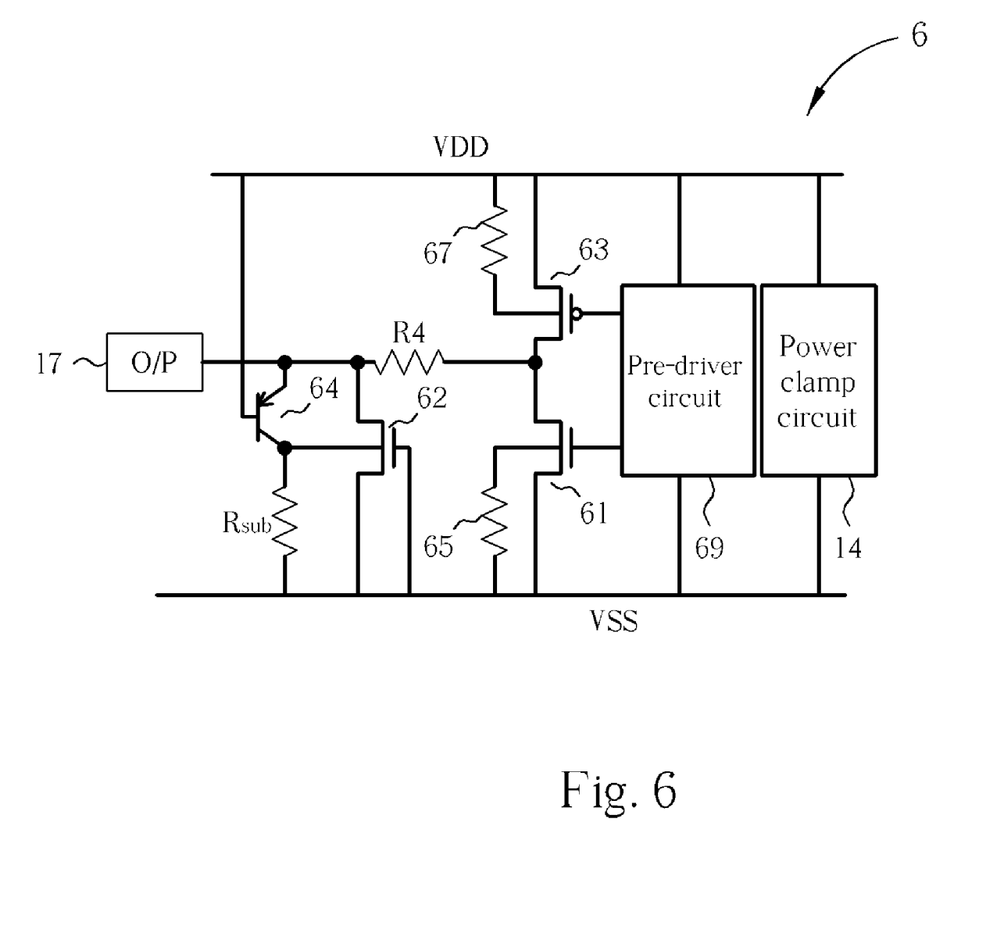

Please refer to FIGS. 5 and 6. FIG. 5 is a diagram of an input ESD protection circuit in an integrated circuit 5 based on the present invention. FIG. 6 is a diagram of an output ESD protection circuit in an integrated circuit 6 based on the present invention. The input ESD protection circuit of the IC 5 comprises an NMOS transistor 52 and a bipolar junction transistor 54 for ESD protection. The NMOS transistor 52 has a drain electrically connected to the input pad 16, a source and a gate both electrically connected to ground (VSS). The bipolar junction transistor 54 has a base electrically connected to VDD, an emitter electrically connected to the input pad 16, and a collector electrically connected to a body of the NMOS transistor 52. A parasitical resistance is between the collector of the bipolar junction transistor 54 and VSS.

The output stage of the IC 6 comprises an output pad (O/P) 17, an output resistor R4, an NMOS transistor 61, a PMOS transistor 63, two resistors 65, 67, and a pre-driver circuit 69. Similar to the input ESD protection circuit of the IC 5, the output ESD protection circuit of the IC 6 comprises an NMOS transistor 62 and a bipolar junction transistor 64. A parasitical resistance is between a collector of the bipolar junction transistor 64 and VSS. The connections are similar to those of FIG. 5, and further description is omitted herein.

Take FIG. 5 in the PS mode for example regarding how the ESD protection circuit of the present invention works. A positive ESD stress is applied to the input pad 16 to discharge the VSS pin connected to ground while the VDD pin and other pins are floating. Since the VDD pin is floating, the potential of the VDD pin rises to high potential due to an E-B junction of the bipolar junction transistor 54. This can turn on the power clamp circuit 14 earlier, and turn on the bipolar junction transistor 54 simultaneously. Therefore, part of ESD current flows from the emitter to the collector of the bipolar junction transistor 54. When ESD current flows to the parasitical substrate resistance $R_{sub}$ through the collector, the NMOS transistor 52 is triggered to bypass ESD current.

As mentioned above, there are two draining paths for ESD current: one is through the E-B junction of the bipolar junction transistor 54 and the power clamp circuit 14 and the other is through the NMOS transistor 52 with lower triggering voltage, which is related to the triggering voltage of the power clamp circuit 14. According to charge/discharge principle, the power clamp circuit 14 is composed of resistors and capacitors. Thus, the present invention can enhance ESD protection.

Figure 7:
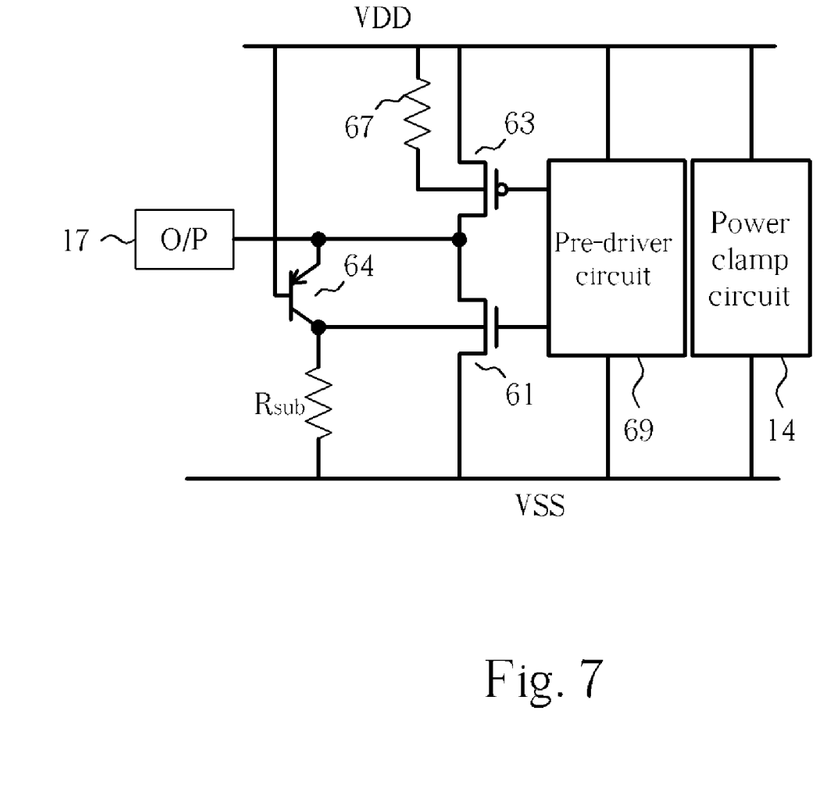

The operation of FIG. 6 is similar to that of FIG. 5 and further description is omitted herein. Additionally, for some kind of circuit designs, if the output resistor R4 is not allowed to be used for reasons of fabrication, the circuit can be simplified as shown in FIG. 7. The output stage of an IC 7 in FIG. 7 omits the output resistor R4 and the NMOS transistor 62. The NMOS transistor 61 replaces the NMOS transistor 62, so that the NMOS transistor 61 is not only regarded as a buffer at the output stage, but is part of the output ESD protection circuit.

Figure 8:
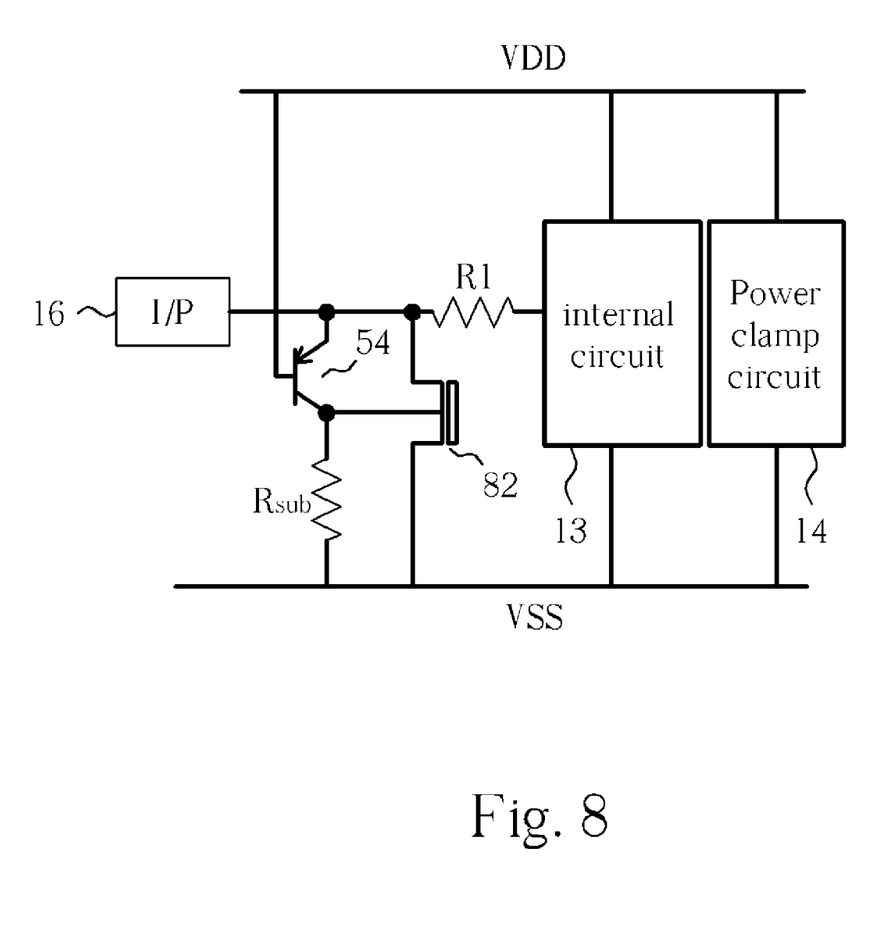
Figure 9:
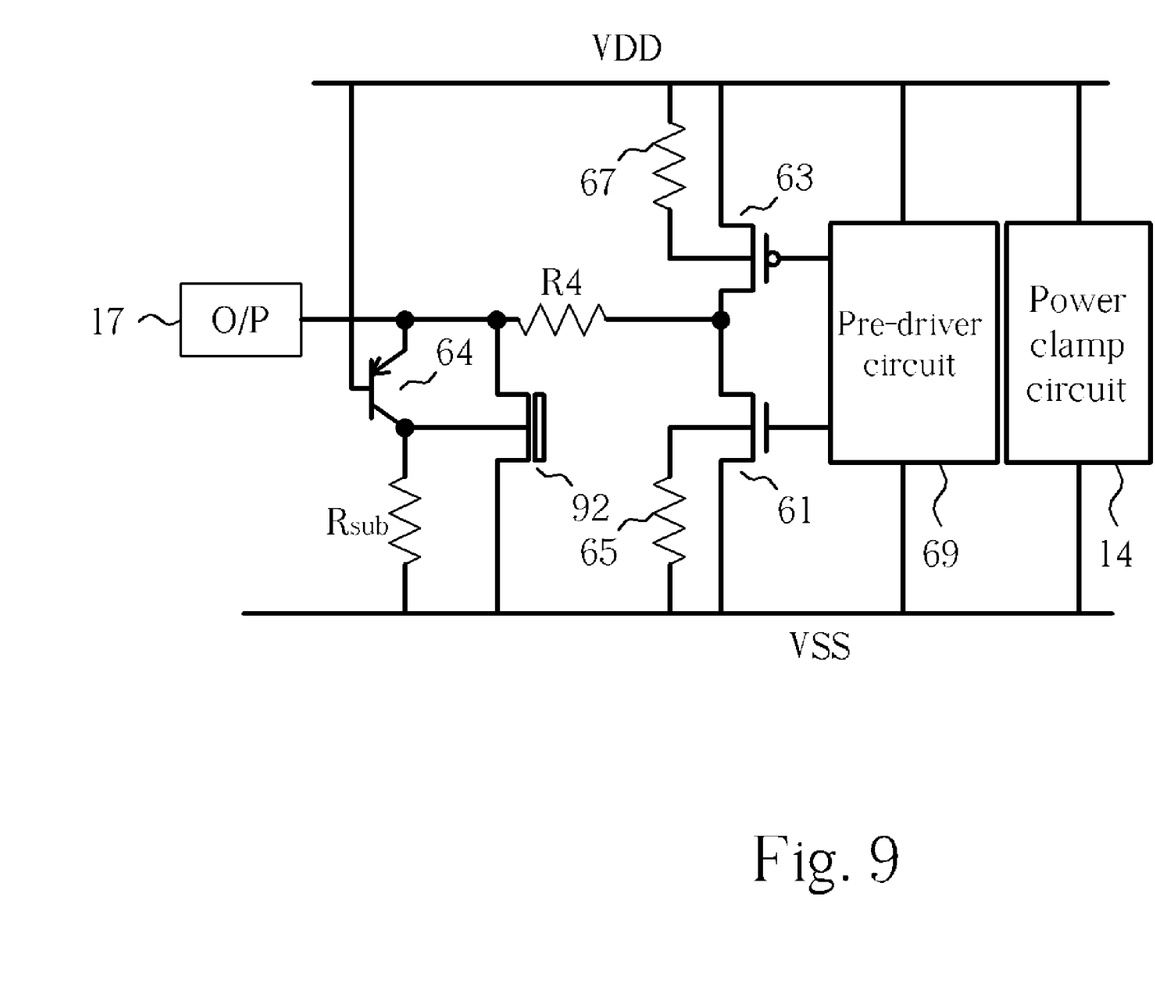

In FIG. 5 to FIG. 7, NMOS transistors are implemented in ESD protection circuits aforementioned, and can be replaced by field-oxide devices or PMOS transistors. Please refer to FIGS. 8 and 9, which correspond to FIGS. 5 and 6, respectively. The input ESD protection circuit of FIG. 8 utilizes a field-oxide device 82 having a drain electrically connected to the input pad 16, a body electrically connected to the collector of the bipolar junction transistor 54, and a source electrically connected to ground. Similarly, the output ESD protection circuit of FIG. 9 utilizes a field-oxide device 92 whose connection is similar to that of the field-oxide device 82.

Figure 10:
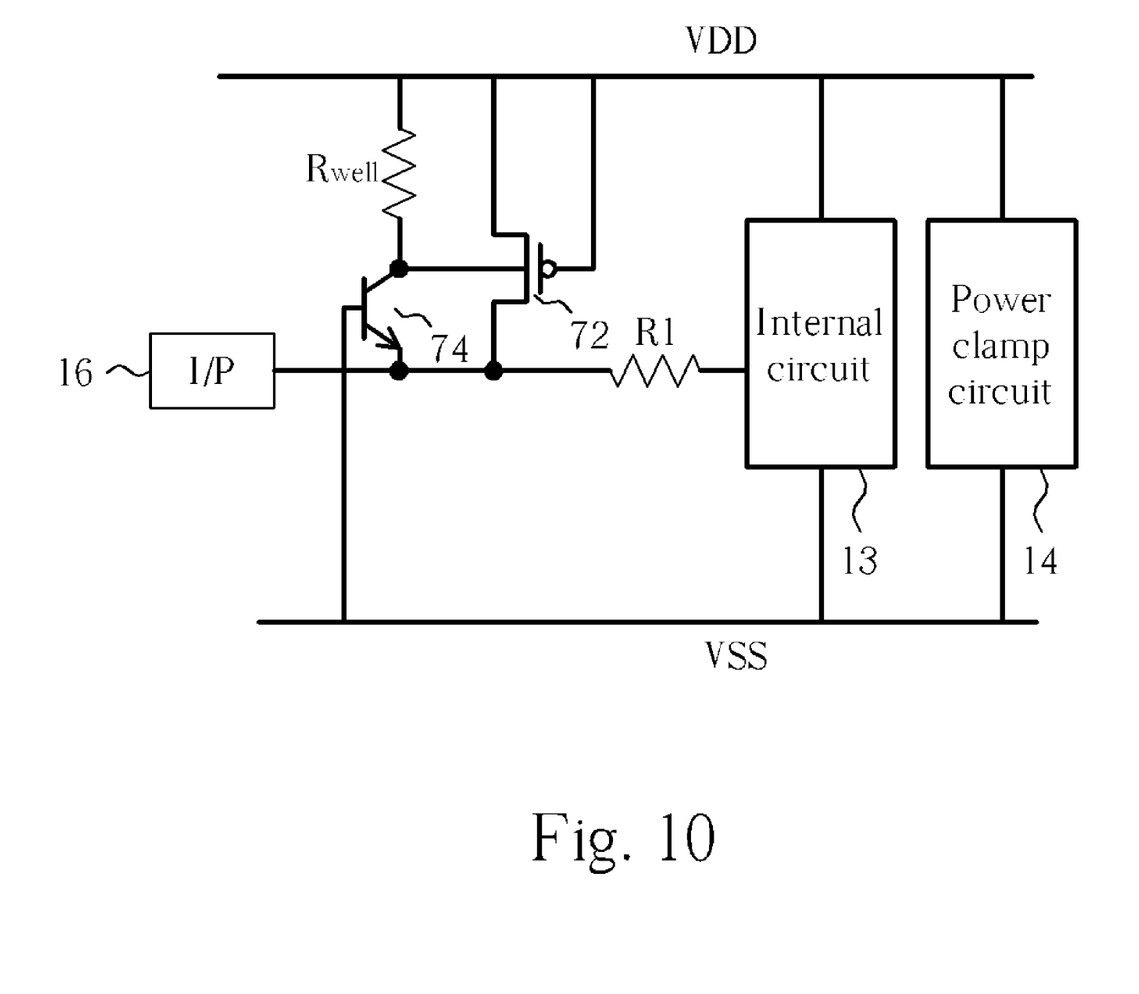
Figure 11:
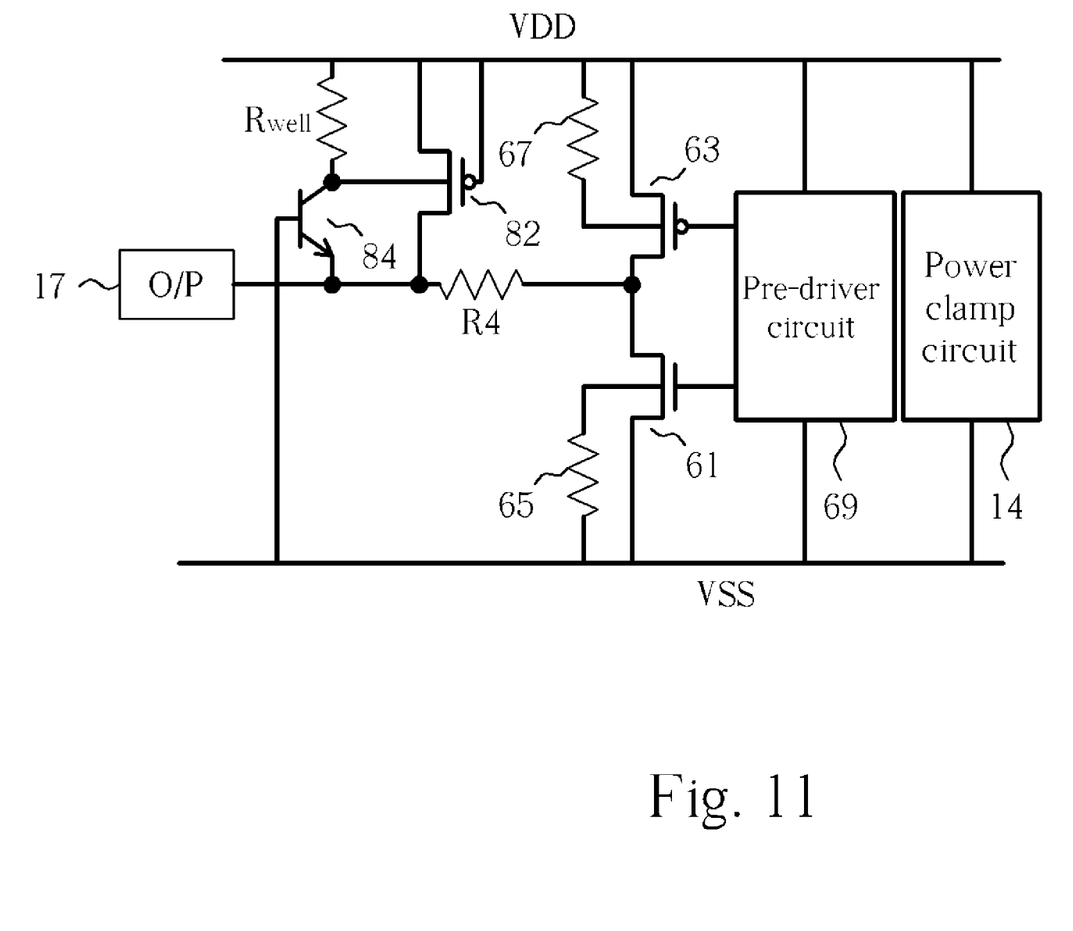
Figure 12:
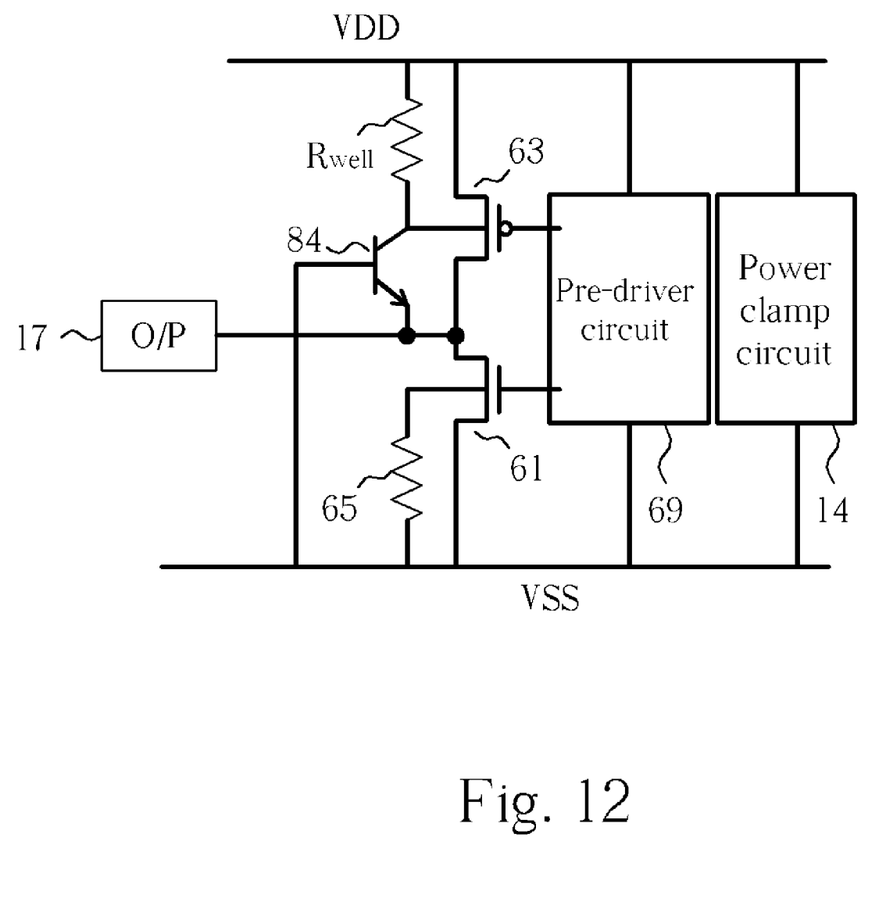

Please refer to FIG. 10 to FIG. 12, which utilize PMOS transistors for ESD protection circuits. FIG. 10 shows an input ESD protection circuit with a PMOS transistor 72. The PMOS transistor 72 has a drain electrically connected to the input pad 16, a source and a gate both electrically connected to VDD. A bipolar junction transistor 74 has an emitter electrically connected to the input pad 16, a base electrically connected to VSS, and a collector electrically connected to VDD. There is a parasitical well resistance $R_{well}$ between the collector of the bipolar junction transistor 74 and VDD.

FIG. 11 shows an output ESD protection circuit with a PMOS transistor 82. The connections of the PMOS transistor 82 and a bipolar junction transistor 84 are similar to those of FIG. 10, and further description is omitted herein. For some kinds of circuit designs, if the output resistor R4 is not permitted for fabrication, the circuit can be simplified as shown in FIG. 12, omitting the output resistor R4 and the PMOS transistor 82.

Take FIG. 10 showing an ND mode for example regarding how the ESD protection circuit with PMOS transistors works. A positive ESD stress is applied to the VDD pin to discharge the input pad 16 connected to ground while the VSS pin and other pins are floating. ESD current flows from the power clamp circuit 14 to the E-B junction of the bipolar junction transistor 74, and then flows to the input pad 16. When ESD current flows through the above draining path, the E-B junction of the bipolar junction transistor 74 is forward-biased simultaneously. That is, the bipolar junction transistor 74 is turned on and thereby ESD current flows from VDD to the parasitical well resistance $R_{well}$, through the collector and emitter of the bipolar junction transistor 74 sequentially, and to the input pad 16. When the voltage potential across the parasitical well resistance $R_{well}$ is large enough to forward-bias a source-body junction of the PMOS transistor 72, this can turn on the PMOS transistor 72 to bypass ESD current. Therefore, there are two draining paths for ESD current: one is through the power clamp circuit 14 and the E-B junction of the bipolar junction transistor 74 and the other is through the PMOS transistor 72.

The present invention conducts a power clamp circuit and applies substrate-trigger technology to enhance ESD protection. Therefore, in the embodiments using NMOS transistors and field oxide devices, the present invention enhances positive ESD stress protection between signal pads (input pads and output pads) and VSS. In the embodiments using PMOS transistors, the present invention enhances negative ESD stress protection between signal pads and VDD.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An integrated circuit with an electrostatic discharge protection circuit, the integrated circuit comprising:
    a first power pad;
    a second power pad;
    a power clamp circuit electrically connected between the first power pad and the second power pad;
    an internal circuit electrically connected between the first power pad and the second power pad;
    a signal pad electrically connected to the internal circuit;
    a bipolar junction transistor having a base electrically connected to the first power pad and an emitter electrically connected to the signal pad; and
    a metal-oxide semiconductor (MOS) transistor having a drain electrically connected to the signal pad, a source electrically connected to the second power pad, and a body electrically connected to a collector of the bipolar junction transistor;
    wherein a parasitical resistance is between the collector of the bipolar junction transistor and the second power pad.

2. The integrated circuit of claim 1 further comprising a resistor electrically connected between the signal pad and the internal circuit.

3. The integrated circuit of claim 1, wherein the MOS transistor is a field-oxide device.

4. The integrated circuit of claim 3, wherein the first power pad is a VDD pad and the second power pad is a ground pad.

5. The integrated circuit of claim 1, wherein the MOS transistor is an NMOS transistor.

6. The integrated circuit of claim 5, wherein a gate of the NMOS transistor is electrically connected to the second power pad.

7. The integrated circuit of claim 6, wherein the first power pad is a VDD pad and the second power pad is a ground pad.

8. The integrated circuit of claim 1, wherein the MOS transistor is a PMOS transistor.

9. The integrated circuit of claim 8, wherein a gate of the PMOS transistor is electrically connected to the second power pad.

10. The integrated circuit of claim 9, wherein the first power pad is a ground pad and the second power pad is a VDD pad.

11. The integrated circuit of claim 1, wherein the signal pad is an input pad or an output pad.

12. An integrated circuit with an electrostatic discharge protection circuit, the integrated circuit comprising:
a VDD pad;
a ground pad;
a power clamp circuit electrically connected between the VDD pad and the ground pad;
a pre-driver circuit electrically connected between the VDD pad and the ground pad;
a p-type metal-oxide semiconductor (PMOS) transistor having a source electrically connected to the VDD pad, a gate electrically connected to the pre-driver circuit, and a body electrically connected to the VDD pad via a resistor;
an n-type metal-oxide semiconductor (NMOS) transistor having a source electrically connected to the ground pad and a gate electrically connected to the pre-driver circuit;
an output pad electrically connected to a drain of the PMOS transistor and a drain of the NMOS transistor; and
a bipolar junction transistor having a base electrically connected to the VDD pad, an emitter electrically connected to the output pad, and a collector electrically connected to a body of the NMOS transistor;
wherein a parasitical resistance is between the collector of the bipolar junction transistor and the ground pad.

13. An integrated circuit with an electrostatic discharge protection circuit, the integrated circuit comprising:
a VDD pad;
a ground pad;
a power clamp circuit electrically connected between the VDD pad and the ground pad;
a pre-driver circuit electrically connected between the VDD pad and the ground pad;
a p-type metal-oxide semiconductor (PMOS) transistor having a source electrically connected to the VDD pad and a gate electrically connected to the pre-driver circuit;
an n-type metal-oxide semiconductor (NMOS) transistor having a source electrically connected to the ground pad, a gate electrically connected to the pre-driver circuit, and a body electrically connected to the ground pad via a resistor;
an output pad electrically connected to a drain of the PMOS transistor and a drain of the NMOS transistor; and
a bipolar junction transistor having a base electrically connected to the ground pad, an emitter electrically connected to the output pad, and a collector electrically connected to a body of the PMOS transistor;
wherein a parasitical resistance is between the collector of the bipolar junction transistor and the VDD pad.

* * * * *